United States Patent
Hsu et al.

(10) Patent No.: US 6,809,341 B2
(45) Date of Patent: Oct. 26, 2004

(54) LIGHT-EMITTING DIODE WITH ENHANCED BRIGHTNESS AND METHOD FOR FABRICATING THE SAME

(75) Inventors: Jung-Kuei Hsu, Taipei (TW); Hsueh-Chih Yu, Hsinchu (TW); Hung-Yuan Lu, Hsinchu (TW); Chui-Chuan Chang, Hsinchu (TW); Kwang-Ru Wang, Chiai (TW); Chang-Da Tsai, Taoyuan (TW); San Bao Lin, Jungli (TW); Yung-Chiang Hwang, Hsinchu (TW); Ming-Der Lin, Hsinchu (TW)

(73) Assignee: Opto Tech University, Hsin Chu (TW)

( * ) Notice: Subject to any disclaimer, the term of this patent is extended or adjusted under 35 U.S.C. 154(b) by 2 days.

(21) Appl. No.: 10/384,619

(22) Filed: Mar. 11, 2003

(65) Prior Publication Data

US 2004/0178415 A1 Sep. 16, 2004

Related U.S. Application Data

(62) Division of application No. 10/095,003, filed on Mar. 12, 2002, now Pat. No. 6,716,654.

(51) Int. Cl.$^7$ ............................................. H01L 27/15
(52) U.S. Cl. .............................. 257/79; 257/91; 257/99
(58) Field of Search .............................. 257/79, 86, 91, 257/99

(56) References Cited

U.S. PATENT DOCUMENTS

| | | | | |
|---|---|---|---|---|
| 5,386,139 A | * | 1/1995 | Idei et al. | 257/466 |
| 5,869,849 A | * | 2/1999 | Jou et al. | 257/96 |
| 5,985,687 A | * | 11/1999 | Bowers et al. | 438/46 |
| 6,015,979 A | * | 1/2000 | Sugiura et al. | 257/86 |
| 6,258,618 B1 | * | 7/2001 | Lester | 438/46 |
| 6,420,732 B1 | * | 7/2002 | Kung et al. | 257/79 |
| 6,472,687 B1 | * | 10/2002 | Wu et al. | 257/79 |
| 6,633,054 B2 | * | 10/2003 | Hirata et al. | 257/96 |

* cited by examiner

Primary Examiner—T. N. Quach
(74) Attorney, Agent, or Firm—Rosenberg, Klein & Lee (57) ABSTRACT

A light-emitting diode with enhanced brightness and a method for fabricating the diode is provided. The light-emitting diode includes an epitaxial LED structure having at least one lighting-emitting active layer with a plurality of windows formed in a highly doped layer. At least one conductive contact is formed on the bottom surface of the highly doped layer. A transparent material layer is formed in the windows. An adhesion layer is formed between the transparent material layer and a permanent substrate. A bottom electrode is formed on the bottom surface of the permanent substrate and an opposed electrode is formed on the top surface of the epitaxial LED structure.

10 Claims, 6 Drawing Sheets

LIGHT-EMITTING DIODE WITH ENHANCED BRIGHTNESS AND METHOD FOR FABRICATING THE SAME

CROSS-REFERENCE TO RELATED APPLICATIONS

This application is a divisional of application 10/095,003, filed on 12 Mar. 2002, now U.S. Pat. No. 6,716,654.

BACKGROUND OF THE INVENTION

1. Field of the Invention

The present invention generally relates to a light-emitting diode and a method for fabricating the same, and more particularly, to a light-emitting diode with enhanced brightness and a method for fabricating such a device, in which some portions of the highly doped layer are removed to form windows to be filled with a transparent material layer so that the light-emitting efficiency can be improved.

2. Description of the Prior Art

The light-emitting diodes (to be abbreviated as LED hereinafter) has received considerable attention for its advantages such as long lifetime, small size, low heat generation, low power consumption, high response speed, monochromic lighting ability, etc. and has been widely used in applications such as computer peripherals, clock displays, display panels, and many other 3C (computer, communication and consumer) products since the 1960s. Particularly, the development in high brightness LEDs has successfully facilitated the LED applications to extend from indoors to outdoors.

Figure 1:
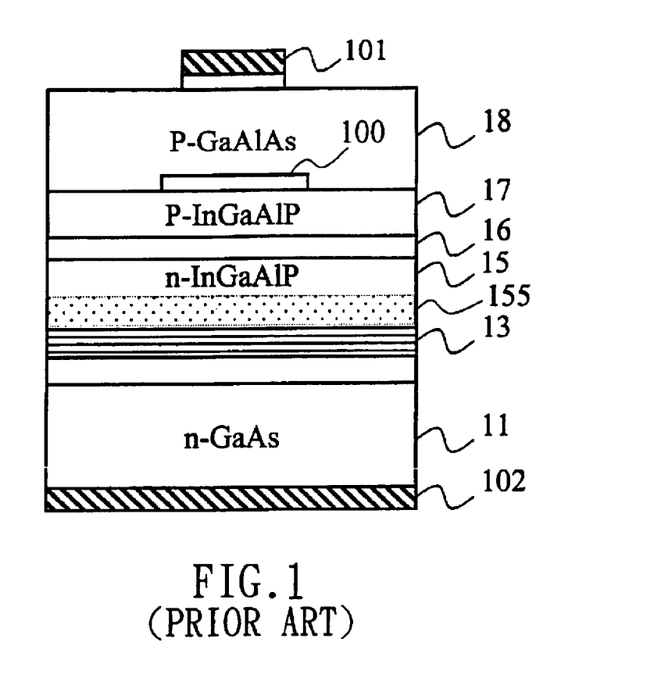
FIG. 1 is a cross-sectional view showing a light-emitting diode in accordance with the prior art.

To further improve the brightness if an LED, there have been disclosed lots of new techniques such as the U.S. Pat. No. 5,153,889, entitled "Semiconductor light emitting device" (filed by Kabushiki Kaisha, Toshiba). This prior art is described as shown in FIG. 1, which comprises: a current diffusion layer 18 formed on an epitaxial LED structure composed of at least a top limiting layer 17, a light-emitting active layer 16, and a bottom limiting layer 15; wherein the current diffusion layer 18 includes a isolator 100 for dividing the operation current into two separate current paths on both sides. There is also a reflective layer 13 inserted between the bottom limiting layer 15 and the substrate 11 for reflecting the light. Of course, a back electrode 102 can be deposited on the bottom surface of the substrate 11 and also, an opposed electrode 101 can be deposited on the top surface of the current diffusion layer 18.

Even though, in the prior art, enhanced-brightness can be achieved by using the current diffusion layer 18, the isolator 100, and the reflective layer 13, there still exist some drawbacks as follow:

1. When the epitaxial LED structure is grown on the substrate, a highly doped layer 155 may be unintentionally formed between the reflective layer 13 and the bottom limiting layer 15. Such a highly doped layer 155 may significantly absorb the incoming light, which may adverse affect the light intensity from the LED.
2. The epitaxial LED structure is limited by the material selecting, required to be lattice-matched to the employed substrate. However, some of the materials are not suitable for use as a substrate for LEDs. For example, a GaAs substrate may absorb the light related to the energy gap of GaAs, which leads to decreased lighting efficiency, and a GaP substrate may display the orange color, which affects the color precision of the light.
3. The isolator 100 adds considerable complexity to the fabrication process when it is to be aligned with the bottom surface of the opposed electrode 101, which results in poor flexibility in the structure design as well as considerable trouble in the complicated fabrication process.

Therefore, a permanent substrate rather than a temporary substrate has been disclosed in, for example, the U.S. Pat. No. 6,258,699 entitled "Light emitting diode with a permanent substrate of transparent glass or quartz and the method for manufacturing the same" (filed by Visual Photonics Epitaxy Co., Ltd.) and the U.S. patent application Ser. No. 09/384,053 entitled "Light emitting diode with enhanced brightness and method for manufacturing the same", to overcome the above problems of the prior art.

Figure 2:
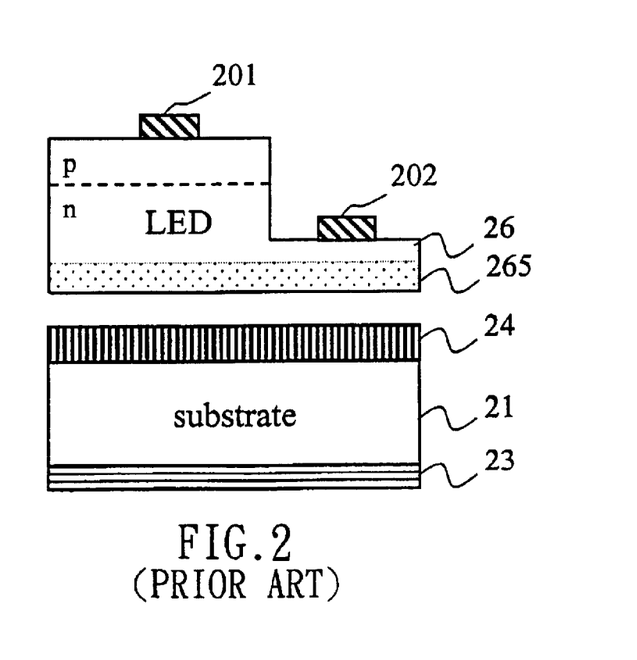
FIG. 2 is a cross-sectional view showing another light-emitting diode in accordance with the prior art.

Please refer to FIG. 2, which is the main structure of an LED disclosed in the U.S. Pat. No. 6,258,699. As shown in the figure, an epitaxial LED structure 26 is formed on a temporary substrate made of GaAs or InP. Then, the temporary substrate is split off and replaced by a permanent substrate 21 made of transparent glass or quartz. A metal adhesive 24 is formed on the top surface of the permanent substrate 21 so as to adhere to the bottom surface of the planar epitaxial LED structure 26. A metal reflective layer 23 is also formed on the bottom surface of the permanent substrate 21. In this manner, when a voltage is applied across diodes 201 and 202, formed on the planar epitaxial LED structure 26, the planar epitaxial LED structure 26 emits light from the p-n junction downward through the transparent glass or quartz layer and the light is reflected by the metal reflective layer 23 such that enhanced brightness of the LED can be achieved. However, there still exist some drawbacks as follow:

1. The problems related to the highly doped layer 265 still cannot be solved, which affects the lighting efficiency of the LED.
2. The reflected light has to travel through the transparent glass or quartz layer, which also affects the lighting efficiency of the LED due to long traveling path of the light.
3. The reflecting layer is formed on the bottom surface of the substrate. Therefore, the permanent substrate has to be formed of a transparent material, which limits the choice of the materials as well as the design of the device.
4. The problems due to the high temperature during operation cannot be solved, which may reduce reliability as well as the lifetime of the device.

Therefore, there is need in providing a light-emitting diode with enhanced brightness and a method for fabricating the same so as to improve the light intensity and operational reliability and further prolong the lifetime.

SUMMARY OF THE INVENTION

Accordingly, it is the primary object of the present invention to provide a light-emitting diode with enhanced brightness, in which some portions of the highly doped layer are removed to form windows to be filled with a transparent material layer so that the problems related to the highly doped layer can be overcome and the light-emitting efficiency can be improved.

It is another object of the present invention to provide a light-emitting diode with enhanced brightness, in which a permanent substrate is used to replace the temporary substrate so that the permanent substrate for LEDs can be made of a thermal conductor, an electrical conductors or a material for changing colors. In this manner, the application field is broadened and the lifetime of the device is prolonged.

It is still another object of the present invention to provide a light-emitting diode with enhanced brightness, in which the metal contacts are placed to effectively program the current path as well as the current density so that the current congestion can be prevented and better light-emitting efficiency can be achieved.

It is still another object of the present invention to provide a method for fabricating a light-emitting diode with enhanced brightness. The method employs a simplified fabrication procedure to overcome the problems related to the highly doped layer. Such a simplified fabrication procedure does not only facilitate mass production but also improve the reliability, resulting in a reduced fabrication cost.

It is still another object of the present invention to provide a method for fabricating a light-emitting diode with enhanced brightness. The method is suitable not only for use in fabricating a vertical LED but also for a planar LED.

In order to achieve the foregoing objects, the present invention provides a light-emitting diode with enhanced brightness, comprising: an epitaxial LED structure having at least one light-emitting active layer with a plurality of windows formed below the light-emitting active layer in a highly doped layer: at least one conductive contact is formed on the bottom surface of the highly doped layer; a transparent material layer formed in the windows; an adhesion layer formed between the transparent material layer and a permanent substrate; a bottom electrode formed on the bottom surface of the permanent substrate; and an opposed electrode formed on the top surface of the epitaxial LED structure.

The present invention further provides a method for fabricating a light-emitting diode with enhanced brightness, comprising the steps of: forming an epitaxial LED structure having at least one lighting-emitting active layer on a temporary substrate, wherein a highly doped layer is naturally formed at the bottom of the lighting-emitting active layer; splitting off the temporary substrate; forming at least one conductive contact on the bottom surface of the highly doped layer; removing portions of the highly doped layer that are not connected to the conductive contact so that a window is formed between two portions of the highly doped layer; filling the window with a transparent material layer; and attaching a permanent substrate to the bottom of the transparent material layer.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing a light-emitting diode with enhanced brightness and a method for fabricating the same can be exemplified by the preferred embodiments as described hereinafter.

Figure 3A:
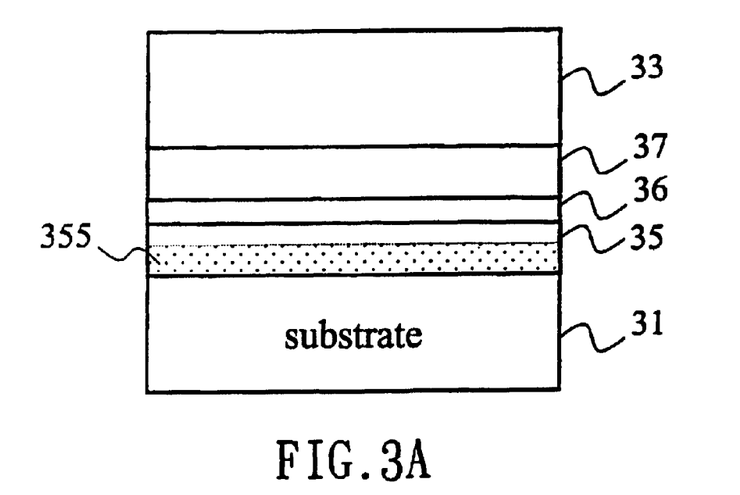
FIG. 3A to FIG. 3G are cross-sectional views showing the fabrication process for an LED in accordance with one embodiment of the present invention.
Figure 3B:
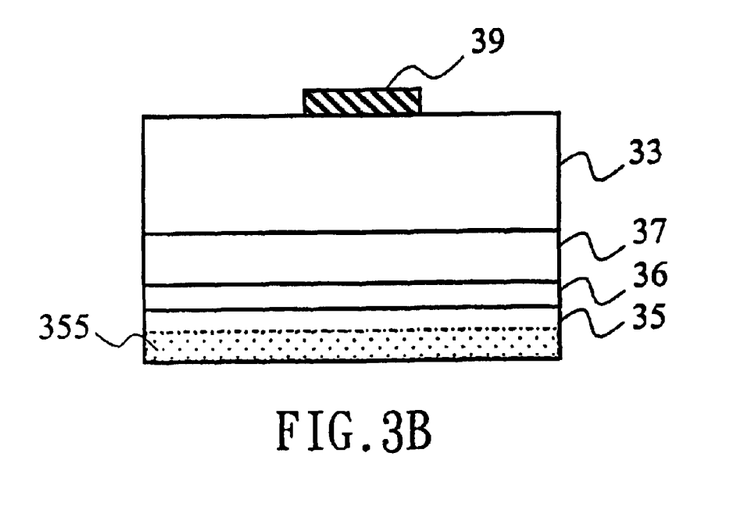
Figure 3C:
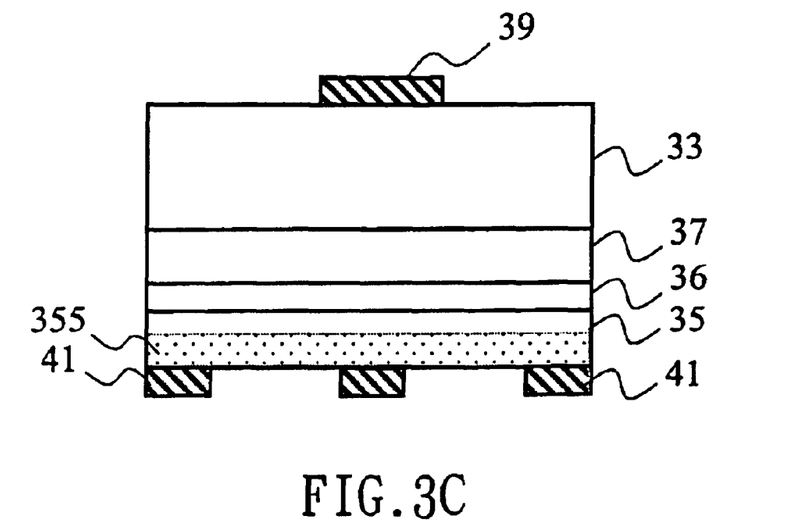
Figure 3D:
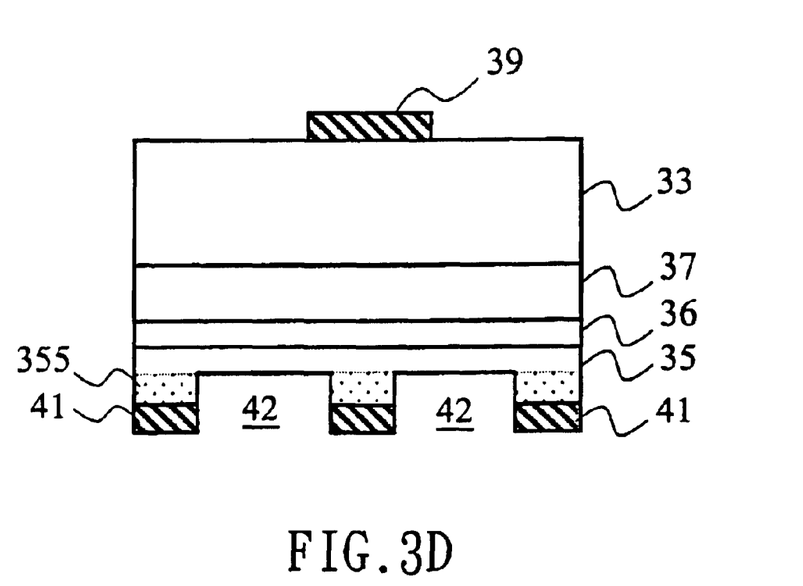
Figure 3E:
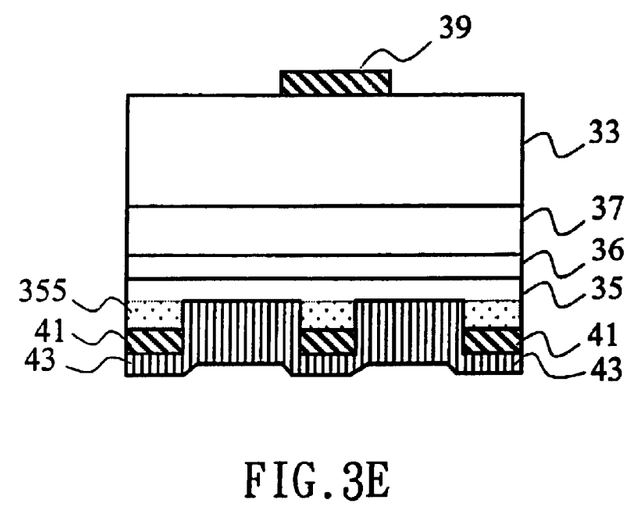
Figure 3F:
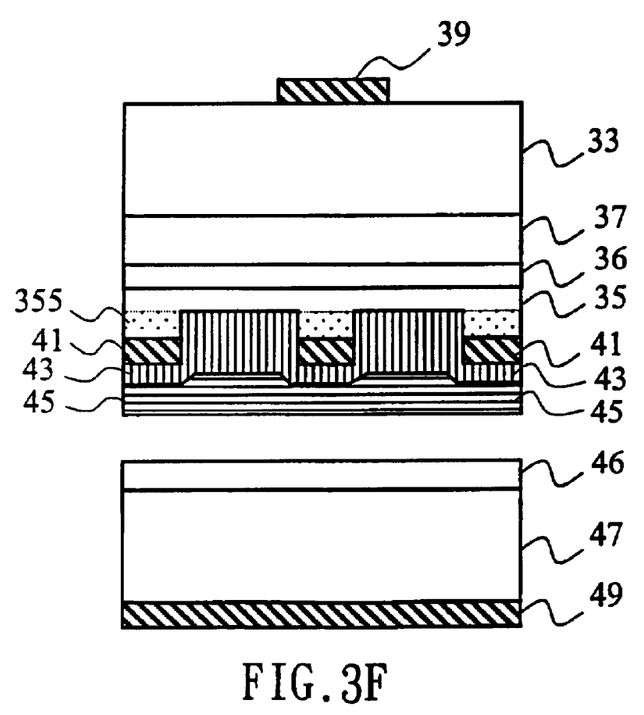
Figure 3G:
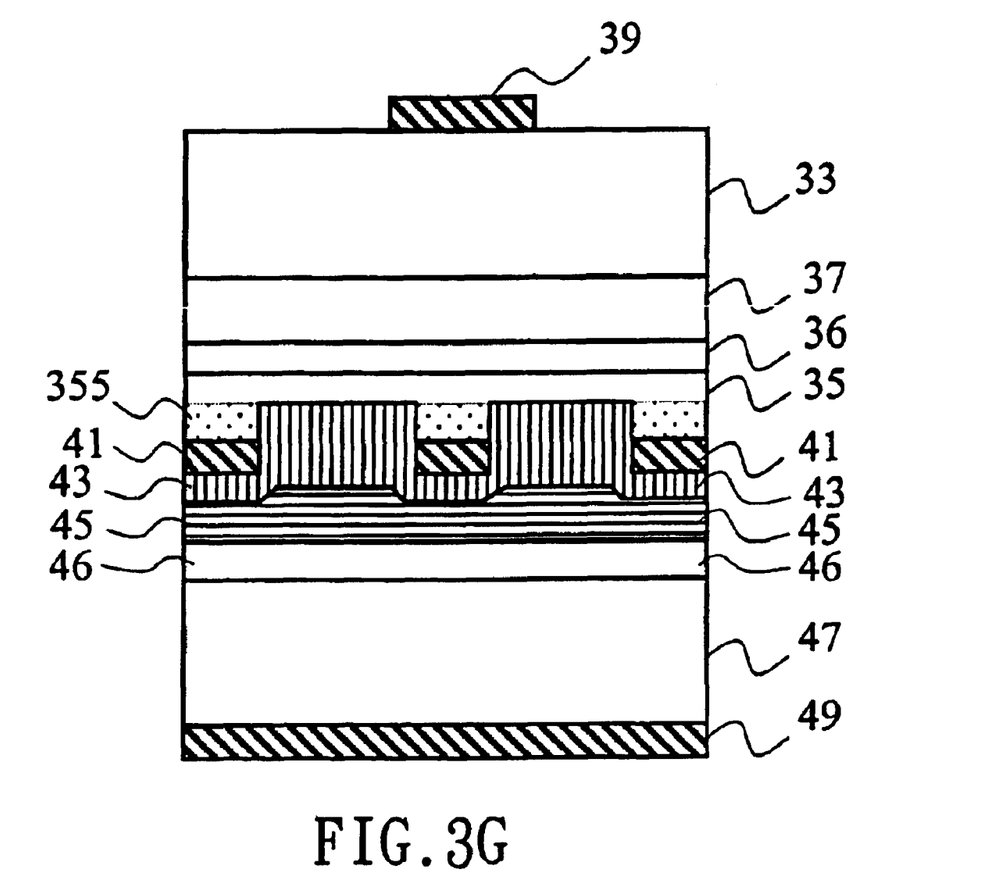

To start with, please refer to FIG. 3A to FIG. 3G, which are cross-sectional views showing the fabrication process for an LED in accordance with one embodiment of the present invention. The method according to the present invention includes the following steps.

a. By using conventional deposition techniques such as sputtering and evaporation, an epitaxial LED structure having a bottom limiting layer 35, a light-emitting active layer 36 and a top limiting layer 37 is formed on a lattice-matched temporary substrate 31. However, in order to facilitate the growth of the epitaxial LED structure on the temporary substrate 31, a highly doped layer 355 is naturally formed at the bottom of the bottom limiting layer 35. The highly doped layer 355 may adversely affect the light-emitting efficiency. In addition, a current diffusion layer 33 is formed on the top surface of the top limiting layer 37, as shown in FIG. 3A.

b. An opposed electrode 39 is formed on the top surface of the current diffusion layer 33. Then, the temporary substrate is split off, as shown FIG. 3B.

c. A plurality of conductive contacts 41 comprising metal, alloy, or other conductive materials are formed on the bottom surface of the highly doped layer 355, as shown in FIG. 3C. Each of the conductive contacts 41 serves as a current path for the LED. Therefore, a large number of small conductive contacts can be widely spread on the bottom surface of the highly doped layer 355 so that current congestion can be prevented by properly programming the current paths.

d. By using conventional material removal techniques such as wet etching and dry etching, portions of the highly doped layer 355 that are not connected to the conductive contacts 41 are removed so that windows 42 are respectively formed between adjacent portions of the highly doped layer 355 overlaid by the contacts 41, as shown in FIG. 3D.

e. A transparent material layer 43 is formed in each of the windows 42 formed in the highly doped layer 355, as shown in FIG. 3E. The transparent material layer can be selected from conductive materials such as ITO, zinc oxide, tin oxide, indium oxide and their combination and insulating materials such as polymer, quartz, glass and their combination. The light-emitting intensity is significantly improved by replacing the photon absorbing layer 355 by the transparent material layer 43.

f. A reflective layer 45 for reflecting light is formed on the bottom surface of the transparent material layer 43. The reflective layer 45 is opposed to the permanent substrate 47 on which an adhesion layer 46 is formed at the top and a bottom electrode 49 is formed at the bottom, as shown in FIG. 3F.

g. The adhesion layer on the top surface of the permanent substrate 47 is attached to the reflective layer 45 on the bottom surface of the epitaxial LED structure so that an LED is completed, as shown in FIG. 3G.

According to the present invention, the temporary substrate is replaced by a permanent substrate so that most portions of the highly doped layer are removed to improve the brightness. The permanent substrate can be formed of a multi-functional material possessing high electrical conductivity, high thermal conductivity and color variation.

In the present embodiment, the permanent substrate 47 is formed of a material selected from Si, BN, AlN, $Al_2O_3$, MgO, $MgO_2$ and their combination so that the high temperature during the LED operation can be prevented so as to improve the reliability as well as the lifetime of the device.

Furthermore, the reflective layer 45 and the adhesion layer 46 can be formed of the same material or, rather, the reflective layer 45 and the adhesion layer 46 can be combined to become an adhered reflecting layer so as to achieve the purpose of the two layers. In addition, in order to dissipate the heat generated from the device, the reflective layer 45 and the adhesion layer 46 can be formed of a material with good thermal conductivity.

The bottom electrode 49 and the opposed electrode 39 are not necessarily formed before the attaching process. In other embodiments, the bottom electrode 49 and the opposed electrode 39 can also be made on the bottom surface of the permanent substrate 47 and the top surface of the current diffusion layer 33, respectively, after the epitaxial LED structure is attached to the permanent substrate 47.

Figure 4:
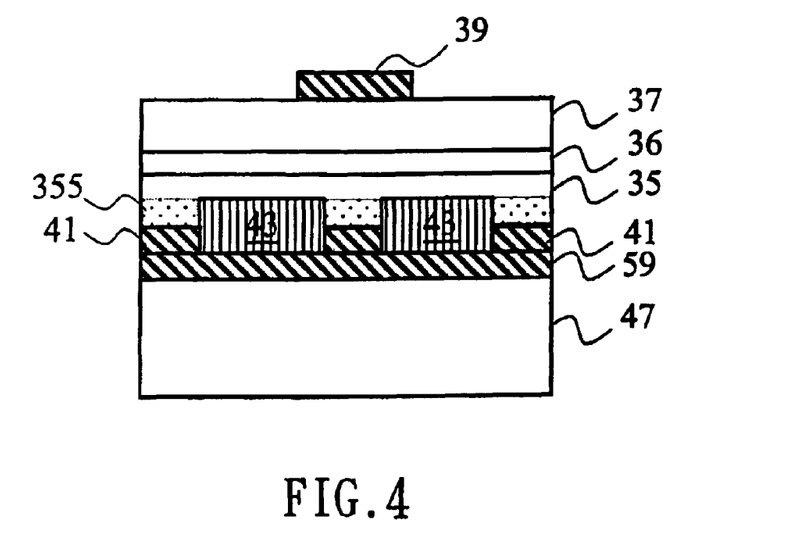
FIG. 4 is a cross-sectional view showing a light-emitting diode in accordance with another embodiment of the present invention.

Furthermore, please refer to FIG. 4, which a cross-sectional view showing a light-emitting diode in accordance with another embodiment of the present invention. As shown in the figure, the substrate (47) can be omitted or the reflective layer (45) can be formed of a material with good electrical conductivity. The bottom electrode 59 is directly formed on the bottom surface of the conductive contacts 41. In addition, the bottom electrode 59 also has good heat dissipation to ensure the operation reliability. Furthermore, the conductive contacts 41 can be used to program the current density as well as the current path so that the use of a current diffusion layer can be avoided.

Figure 5:
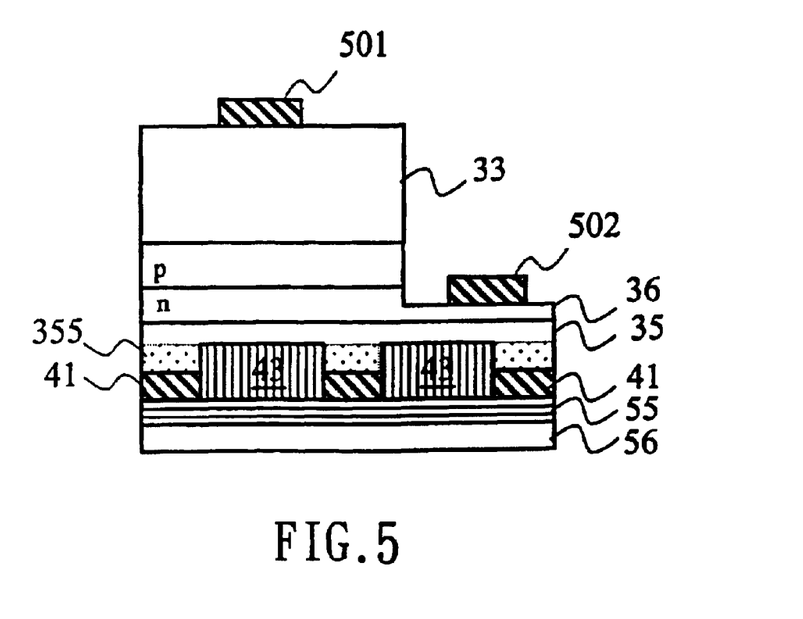
FIG. 5 is a cross-sectional view showing a light-emitting diode in accordance with another embodiment of the present invention.

Finally, please refer to FIG. 5, which is a cross-sectional view showing a light-emitting diode in accordance with another embodiment of the present invention. As shown in the figure, the vertical LED is replaced by a planar LED. The epitaxial LED structure 36 can be attached to the permanent substrate 47 by using the reflective layer 55 or the adhesion layer 56. The conductive contacts 41 as well as the transparent material layer 43 can replace portions of the highly doped layer 355. Therefore, light of high intensity emits when there is a current between the first electrode 501 and the second electrode 502.

According to the above discussion, it is apparent that the present invention discloses a light-emitting diode with enhanced brightness and a method for fabricating the same, in which some portions of the highly doped layer are removed to form windows to be filled with a transparent material layer so that the light-emitting efficiency can be improved. Therefore, the present invention has been examined to be progressive, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A light-emitting diode with enhanced brightness, comprising:

an epitaxial LED structure having at least one light-emitting active layer and a highly doped layer, said highly doped layer having a plurality of windows formed therethrough;

at least one conductive contact formed on a bottom surface of said highly doped layer;

a transparent material layer formed in said windows;

an adhesion layer formed between said transparent material layer and a permanent substrate;

a bottom electrode formed on a bottom surface of said permanent an opposed electrode formed on a top surface of said epitaxial LED structure.

2. The light-emitting diode of claim 1, further comprising a reflective layer formed between said transparent layer and said adhesion layer.

3. The light-emitting diode of claim 2, wherein said reflective layer and said adhesion layer are formed of a same material composition.

4. The light-emitting diode of claim 1, further comprising a current diffusion layer formed between said epitaxial LED structure and said opposed electrode.

5. The light-emitting diode of claim 1, wherein said adhesion layer is a bottom electrode.

6. The light-emitting diode of claim 1, wherein said transparent material layer is selected from the group of conductive materials consisting of ITO, zinc oxide, tin oxide, indium oxide and combinations thereof.

7. The light-emitting diode of claim 1, wherein said transparent material layer is selected from the group of insulating materials consisting of polymer, quartz, glass and combinations thereof.

8. The light-emitting diode of claim 1, wherein said permanent substrate is formed of a material with good thermal conductivity characteristics.

9. The light-emitting diode of claim 8, wherein said permanent substrate is formed of one of Si, BN, AlN, $Al_2O_3$, MgO, $MgO_2$ and combinations thereof.

10. The light-emitting diode of claim 1, wherein said epitaxial LED structure is selected from a vertical LED structure and a planar LED structure.

* * * * *

UNITED STATES PATENT AND TRADEMARK OFFICE
CERTIFICATE OF CORRECTION

PATENT NO. : 6,809,341 B2
DATED : October 26, 2004
INVENTOR(S) : Jung-Kuei Hsu et al.

It is certified that error appears in the above-identified patent and that said Letters Patent is hereby corrected as shown below:

<u>Title page,</u>
Item [75], Inventors, insert the additional inventors
-- Chia-Liang Hsu, Hsinchu (TW); Yen-Hu Chu, Hsinchu (TW) --

Signed and Sealed this

Eighteenth Day of January, 2005

JON W. DUDAS
*Director of the United States Patent and Trademark Office*